United States Patent
Darrow

[11] 4,009,403
[45] Feb. 22, 1977

[54] LOW GAIN PULSE GENERATING CIRCUIT

[75] Inventor: John O. G. Darrow, Murrysville, Pa.

[73] Assignee: Westinghouse Air Brake Company, Swissvale, Pa.

[22] Filed: May 16, 1975

[21] Appl. No.: 578,350

[52] U.S. Cl. .............................. 307/268; 307/236; 307/237; 307/288

[51] Int. Cl.² ...................... H03K 5/01; H03K 6/06

[58] Field of Search ...... 307/236, 268, 237, 247 A, 307/288, 313, 230

[56] References Cited
UNITED STATES PATENTS

| | | | |
|---|---|---|---|
| 2,770,732 | 11/1956 | Chong | 307/228 X |
| 2,958,789 | 11/1960 | Lee | 307/288 |
| 3,089,036 | 5/1963 | Sommerfield | 307/288 X |
| 3,374,366 | 3/1968 | Kleinberg | 307/288 |
| 3,535,557 | 10/1970 | Rogers et al. | 307/268 |

*Primary Examiner*—John S. Heyman
*Attorney, Agent, or Firm*—J. B. Sotak; R. W. McIntire, Jr.

[57] ABSTRACT

This invention relates to a highly reliable and relatively noise immune electronic pulse generating circuit employing a low gain transistorized trigger circuit having its input coupled to a source of A.C. input signals and having its output coupled to a differentiating circuit for producing a single sharp narrow pulse during each cycle of the A.C. input signals.

10 Claims, 2 Drawing Figures

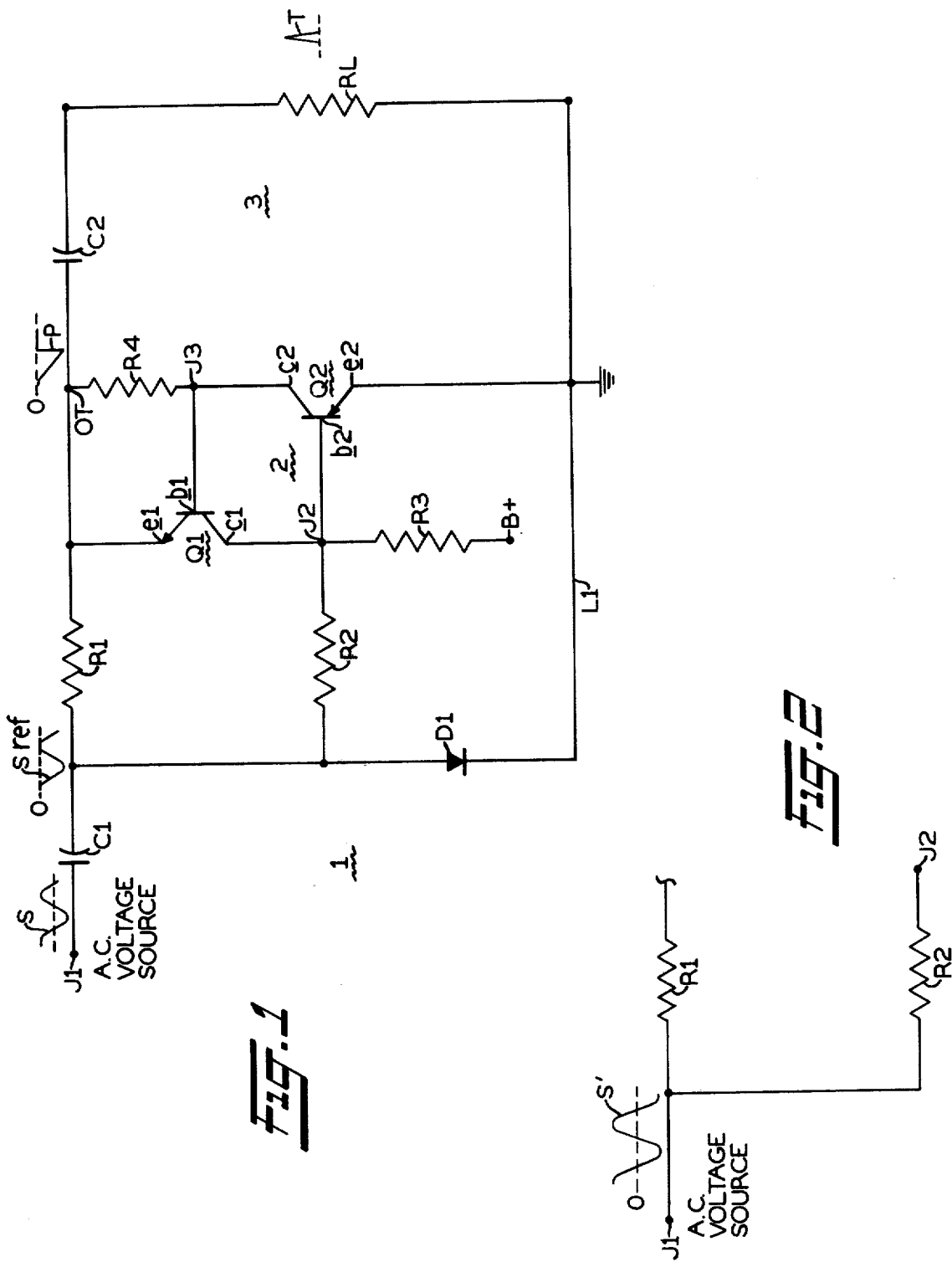

4,009,403

LOW GAIN PULSE GENERATING CIRCUIT

SUBJECT OF THE INVENTION

This invention relates to an electronic pulse generating circuit and more particularly to an extremely reliable semiconductive circuit arrangement employing a solid-state trigger circuit having its imput coupled to a source of sinusoidal voltage and having its output coupled to a differentiating circuit for producing a voltage spike during each cycle that the sinusoidal voltage exceeds a predetermined value.

BACKGROUND OF THE INVENTION

In various types of signal and control systems, such as railroad cab signaling systems, the actual speed of moving railway vehicles, is determined by a frequency generator which is driven by the wheels of the vehicles. In practice, the wheel driven generator produces a distorted sinusoidal alternating current signal having a frequency proportional to the speed on the moving vehicle. At first glance, it would appear plausible to simply increase the amplitude of the picked up signals by employing a high gain amplifier and clipping to produce a square wave signal which can then be differentiated to obtain a pulse signal. One of the problems with such a high gain amplifier arrangement resided in the fact that noise and other spurious signals even though of small amplitude could result in false speed signal pulses which can result in the unsafe operation of the railway vehicles. Another method of processing the picked up alternating current signals would be to utilize a switching circuit, such as a Schmitt trigger for squaring the sinusoidal waves. It will be appreciated that Schmitt trigger switching circuits are subject to the loss of hysteresis resulting in high gain due to various component failures which allow noise pulses to cause erratic and unsafe operation. Hence, it is essential that a pulse generating circuit which is intended to be used in a vehicle speed measuring operation must have high degree of immunity to noise and other spurious signals which are ever present in a cab signaling system. Since the number of generated electrical pulses is proportional to the actual speed of the moving vehicle, it is vital to ensure noise signals do not adversely effect the speed measuring ability of the cab signaling apparatus. That is, random noise or transient pulses should not be capable of changing the pulse rate of the signal generating circuit so as to cause the production of an erroneous speed measurement. Thus, an acceptable speed pulse generating circuit for cab signaling equipment must be highly insensitive to noise in order to provide the highest degree of safety to individuals utilizing the system. In addition, the security of the overall cab signaling system is predicated upon the fail-safe design of the apparatus and the high reliability of the operation of the apparatus.

OBJECTS AND SUMMARY OF THE INVENTION

Accordingly, it is an object of the invention to provide a new and improved solid-state pulse generating circuit.

Another object of this invention is to provide a novel semiconductive pulse generating circuit which is highly immuned to noise signals.

A further object of this invention is to provide a unique noise immune circuit arrangement employing a semiconductive trigger circuit and a differentiating circuit for producing a single output pulse for each cycle of an input alternating current voltage.

Yet another object of this invention is to provide a highly reliable pulse generating circuit for producing signal pulses proportional to the speed of a moving vehicle in a cab signaling system.

Yet a further object of this invention is to provide a unique circuit arrangement having a transistorized trigger circuit and a differentiating circuit for generating a sharp voltage spike for each cycle of a sinusoidal voltage.

Still another object of this invention is to provide a highly reliable pulse generator employing a solid-state trigger and a differentiator for producing a narrow pulse for each cycle of an A.C. voltage.

Still a further object of this invention is to provide a pulse generating circuit including a source of alternating current voltage, a semiconductive trigger circuit having an input and an output, the input of the semiconductive trigger circuit coupled to the source of alternating current voltage, and a differentiating circuit coupled to the output of the semiconductive trigger circuit for producing a narrow voltage pulse during one alternation of each cycle of the alternating current voltage.

An additional object of this invention is to provide a new and unique pulse generator which is economical in cost, simple in design, reliable in operation, durable in use and efficient in service.

In accordance with the present invention, there is provided an electronic pulse generating circuit including a source of alternating current voltage, coupled to the input of a transistorized trigger circuit. The trigger circuit includes a pair of complementary transistors interconnected in a positive feedback configuration. The collector electrode of the PNP transistor is connected directly to the base electrode of the NPN transistor while the collector electrode of the NPN transistor is connected directly to the base electrode of the PNP transistor. The base electrode of the PNP transistor and the collector electrode of the NPN transistor are coupled to a voltage supply terminal by a biasing resistor. A first current limiting resistor couples the base electrode of the PNP transistor and the collector electrode of the NPN transistor to the source of alternating current voltage while a second current limiting resistor couples the emitter electrode to the source of alternating current voltage. The emitter electrode of the PNP transistor is connected directly to ground while the collector electrode of the PNP transistor and the base electrode of the NPN transistor are coupled to a D.C. referencing resistor. A differentiating circuit including a series connected capacitor and a load resistor is connected across the output of the transistorized trigger circuit for producing a narrow voltage pulse during the appearance of one alternation of each cycle of the alternating current voltage on the input of the transistorized trigger circuit. When the amplitude of the peak value of the alternating current voltage is sufficient to trigger the transistorized trigger circuit, the source of alternating current voltage is directly connected to the input of the transistorized trigger circuit. Conversely, when the magnitude of the peak value is not great enough to fire the transistor trigger circuit, the source of alternating current voltage is referenced to ground by adding a reference circuit including a coupling capacitor and semiconductive diode to allow the peak-to-peak amplitude to fire the transistorized trigger circuit.

BRIEF DESCRIPTION OF THE DRAWINGS

Other objects, features and advantages will become more clearly understood and apparent from the following detailed description when read in conjunction with the accompanying drawings, in which like elements or components are designated by like reference numerals and in which:

FIG. 1 is a schematic circuit diagram illustrating an electronic pulse generating circuit which is referenced to ground in accordance with the teachings of the present invention.

FIG. 2 is a partial schematic circuit diagram of the subject invention in which the input to the transistorized trigger circuit is directly connected to the A.C. voltage source.

DESCRIPTION OF THE INVENTION

Referring now to the drawings, and in particular to FIG. 1, there is shown an improved electronic pulse generating circuit employing a reference circuit 1, a trigger circuit 2 and a differentiating circuit 3.

In practice when the peak amplitude of the alternating current voltage to be applied to terminal J1 is insufficient to cause triggering or switching of the trigger circuit 3, it is necessary to reference the A.C. voltage source to ground or to a zero reference level. The referencing of the A.C. voltage to ground causes the entire peak-to-peak amplitude to be applied as a negative polarity to the input of the trigger circuit. The reference circuit 1 includes a series connected coupling capacitor C1 and semiconductive diode D1. As shown, one plate of the capacitor C1 is connected to the A.C. input terminal J1 while the other plate of the capacitor C1 is connected to the anode electrode of diode D1. The cathode electrode of diode D1 is connected directly to lead L1 which is grounded. Thus, the A.C. voltage applied to terminal J1 is referenced to ground and in turn is applied to the input terminal of the trigger circuit 2.

The trigger circuit 2 is a semiconductive or solid-state switching network including a pair of complementary transistors Q1 and Q2 connected in a positive feedback configuration having low gain, such as, unity. The NPN transistor Q1 includes an emitter electrode $e1$, collector electrode $c1$ and a base electrode $b1$ while the PNP transistor Q2 includes an emitter electrode $e2$, a collector electrode $c2$ and a base electrode $b2$. As shown, the collector electrode $c1$ of the transistor Q1 is connected directly to the base electrode $b2$ of transistor Q2 while the collector electrode $c2$ of transistor Q2 is connected directly to the base electrode $b1$ of transistor Q1. A current limiting resistor R1 connects the other plate of capacitor C1 to the emitter electrode $e1$ of transistor Q1 while a current limiting resistor R2 also connects the other plate of capacitor C1 to the junction point J2 which is common to base electrode $b2$ and collector electrode $c1$. A biasing resistor R3 connects the positive voltage terminal B+ of a suitable D.C. power supply (not shown) to the junction point J2. It will be noted that the junction point J3 common to the base electrode $b1$ and collector electrode $c2$ is connected to the output terminal OT of the trigger circuit 2 through resistor R4.

As shown, the output terminal OT is coupled to the differentiating circuit 2 formed by the series connected capacitor C2 and load resistor RL. The left plate of capacitor C2 is connected to terminal OT while the right plate is connected to one end of resistor RL. The other end of resistor RL is connected to ground.

In describing the operation of the pulse generating circuit of FIG. 1, it will be assumed that the circuit components are intact and operating properly, that the D.C. bias supply voltage B+ is applied to resistor R3 and that the sinusoidal speed signals S produced by the frequency generator are applied to terminal J1. As mentioned above, it will be assumed that the peak value of the frequency speed signals S is insufficient to cause triggering of the trigger circuit 2. In this case the signals S are referenced to ground or zero volts as shown by the next wave form which shows the signals below the zero reference line so that the peak-to-peak amplitude of the signals $S_{ref}$ may be advantageously employed for triggering purposes. It will be appreciated that voltage on junction point J2 is biased at a positive level by voltage dividing network formed by resistor R3 and R2 and diode D1. Thus, the transistors Q1 and Q2 are biased to a nonconductive condition. Now as the sinusoidal signal S proceeds along its negative excursion, a point is reached at which the instantaneous negative value causes the bias voltage on junction point J2 to become negative. Under this condition, the base-emitter junction of transistor Q2 becomes forwardly biased so that transistor Q2 becomes conductive. The conduction of transistor Q2 forwardly biases the base electrode $b1$ with respect to the emitter electrode $e1$ so that transistor Q1 is rendered conductive. Thus, the trigger circuit 2 fires so that the negative going voltage on output terminal OT suddenly rises toward ground which results in a pulse P having a relatively steep rising edge. The pulse P produced on terminal OT is differentiated by the capacitor C2 and resistor RL so that a narrow sharp voltage pulse or spike T is developed across the resistor RL. It will be appreciated that the amplitude of the output pulse T is no larger than the magnitude of the input signals S and that neither an active nor a passive component or circuit failure can produce an output pulse having an amplitude which is greater than that of the input signal. It will be noted that the transistors Q1 and Q2 will remain conductive for the remainder of the cycle of the sinusoidal wave so that the trigger is effective immunity to noise or transients which may be present in the milieu. When the input voltage excursion of the cycle is completed, namely, when the input signal S reaches the zero or reference voltage level, the transistors Q1 and Q2 will revert to their nonconducting condition. Upon appearance of the negative going excursion of the next cycle of the input signal S, a point again is reached where the instantaneous value of the A.C. input signal exceeds the D.C. bias potential on junction point J2. Accordingly, the trigger circuit 2 will again fire and produce a pulse P on output terminal which is differentiated by circuit 3 to cause the narrow sharp spike T to be developed across resistor RL. Thus, the presently described pulse generating circuit is highly immuned to noise so that only a single pulse or spike T is produced for each cycle of the A.C. voltage signal appearing on terminal J1. As previously mentioned, the cycles per second (CPS) of the input signal S are proportional to the speed of the railway vehicle, and accordingly the pulses per second (PPS) of the output signal pulses are also directly proportional to the speed of the railway vehicle. Further, it will be noted that the low gain of the pulse generating circuit also contributes to the low sensitivity to noise since output would result from noise signals when they are as large as the desired signal. In addition, the circuit is not adversely effected by circuit and component failures since it is highly unlikely that the gain will be increased. Hence, the presently described pulse generating circuit is highly reliable and also is relatively immuned to spurious noises and transients.

Turning now to FIG. 2, there is shown a partial schematic circuit diagram of a modified version of the pulse generating circuit of the present invention. As previously mentioned, when the amplitude of the peak value of A.C. input signals S' is relatively large, the zero reference circuit 1 be omitted, and the input signals S' may be applied directly to the input of the trigger circuit via resistors R1 and R2 which are connected to input terminal J1. Under this condition, the negative alternation of each cycle will result in the production of a narrow pulse or output spike in substantially the same manner as described above. Thus, only a single pulse or spike will be produced during each cycle of the A.C. input applied to terminal J1.

It will be appreciated that various changes, modifications and alterations may be employed without departing from the spirit and scope of this invention. For example, the pulse generating circuit may be actuated by the positive alternation of the input signal by reversing the positive of the D.C. supply voltage, the diode D1 and the transistors Q1 and Q2. Further, the transistors Q1 and Q2 may be replaced by other semiconductive devices, such as, silicon conductive rectifiers or the like. In addition, it is understood that the present invention finds particular utility in cab signaling equipment, and, in particular to speed command control apparatus, it is readily evident that this invention may be employed in various other systems, such as, security circuits and equipment which require the high reliability of operation and the great immunity to noise possessed of this invention. Thus, it is understood that the showing and description of the present invention should be taken in an illustrative and diagrammatic sense only.

Having now described the invention, what I claim as new and desire to secure by Letters Patent, is:

1. A low gain pulse generating circuit comprising, a source of alternating current voltage, a bistable semiconductive trigger circuit having an input and an output including means for biasing said trigger circuit for operating said pulse generating circuit at near unity gain, said input of said semiconductive trigger circuit coupled to said source of alternating current voltage, and a differentiating circuit coupled to the output of said semiconductive trigger circuit for producing a narrow voltage pulse during one alternation of each cycle of said alternating current voltage, and said narrow voltage pulse having an amplitude which is incapable of being larger than the magnitude of said alternating current voltage due to the low gain exhibited by said pulse generating circuit.

2. A pulse generating circuit as defined in claim 1, wherein said semiconductive trigger circuit includes a pair of complementary transistors.

3. A pulse generating circuit as defined in claim 1, wherein said semiconductive trigger circuit includes a PNP and an NPN transistor interconnected in a positive feedback configuration.

4. A pulse generating circuit as defined in claim 1, wherein said source of alternating current voltage is referenced to ground by a capacitor and a diode.

5. A pulse generating circuit as defined in claim 1, wherein a reference circuit is coupled between said source of alternating current voltage and said input of said semiconductive triggering circuit.

6. A pulse generating circuit as defined in claim 1, wherein said differentiating circuit includes a capacitor and an resistor.

7. A pulse generating circuit as defined in claim 1, a coupling capacitor and a diode reference said source of alternating current voltage to a zero potential level.

8. A pulse generating circuit as defined in claim 1, wherein said source of alternating current voltage is a sinusoidal potential.

9. A pulse generating circuit as defined in claim 1, wherein said trigger circuit includes an NPN transistor and a PNP transistor each having its collector electrode directly coupled to the base electrode of the respective transistor.

10. A pulse generating circuit as defined in claim 9, wherein a first resistor couples the emitter electrode of said NPN transistor to said source of alternating current voltage and a second resistor couples said base electrode of said PNP transistor to said source of alternating current voltage.

* * * * *